United States Patent
Sasaki

(10) Patent No.: US 7,456,075 B2
(45) Date of Patent: *Nov. 25, 2008

(54) RESISTANCE DIVIDING CIRCUIT AND MANUFACTURING METHOD THEREOF

(75) Inventor: Seiichiro Sasaki, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 72 days.

This patent is subject to a terminal disclaimer.

(21) Appl. No.: 11/595,924

(22) Filed: Nov. 13, 2006

(65) Prior Publication Data

US 2007/0057345 A1 Mar. 15, 2007

Related U.S. Application Data

(62) Division of application No. 11/016,323, filed on Dec. 20, 2004, now Pat. No. 7,135,376.

(30) Foreign Application Priority Data

Dec. 24, 2003 (JP) .............................. 2003-426996

(51) Int. Cl.
    *H01L 21/00* (2006.01)
    *H01L 29/00* (2006.01)
    *H01C 1/14* (2006.01)

(52) U.S. Cl. ................ 438/382; 257/537; 338/323

(58) Field of Classification Search ............... 257/537; 438/382; 338/323
See application file for complete search history.

(56) References Cited

U.S. PATENT DOCUMENTS

| 5,285,169 | A | 2/1994 | Theus |
| 5,339,067 | A | 8/1994 | Harris et al. |
| 5,523,721 | A | 6/1996 | Segawa et al. |
| 5,963,784 | A | 10/1999 | Bothra et al. |
| 6,013,940 | A | 1/2000 | Harada et al. |
| 6,403,943 | B2 | 6/2002 | Wada et al. |
| 6,667,537 | B1 | 12/2003 | Koike et al. |
| 6,700,474 | B1 | 3/2004 | Leibiger |
| 7,135,376 | B2 * | 11/2006 | Sasaki ........................ 438/382 |
| 2002/0123202 | A1 | 9/2002 | Amishiro et al. |
| 2003/0178967 | A1 | 9/2003 | Lee et al. |
| 2004/0196063 | A1 | 10/2004 | Womg et al. |
| 2004/0235258 | A1 | 11/2004 | Wu et al. |

FOREIGN PATENT DOCUMENTS

JP 5-30072 B2 5/1993

* cited by examiner

*Primary Examiner*—Evan Pert
(74) *Attorney, Agent, or Firm*—Volentine & Whitt, P.L.L.C.

(57) ABSTRACT

A resistance dividing circuit including silicide layers respectively formed only on branch portions of a linear polysilicon resistance wiring having the branch portions. Contact plugs are connected to the resistance wiring via the silicide layers, and fetching electrodes are respectively connected to the contact plugs.

10 Claims, 5 Drawing Sheets

RESISTANCE DIVIDING CIRCUIT AND MANUFACTURING METHOD THEREOF

CROSS REFERENCE TO RELATED APPLICATIONS

This is a divisional application of application Ser. No. 11/016,323, filed Dec. 20, 2004, now U.S. Pat. No. 7,135,376 which is hereby incorporated by reference in its entirety for all purposes.

BACKGROUND OF THE INVENTION

The present invention relates to a resistance dividing circuit employed in a semiconductor integrated circuit and a method for manufacturing the resistance dividing circuit, using a salicide process.

A resistance dividing circuit has such a shape as shown in FIG. 6 by way of example, illustrated in plan view. The resistance dividing circuit shown in FIG. 6 has a configuration wherein contact plugs are respectively connected to plural points of a resistance wiring composed of polysilicon, and metal wirings are respectively connected to the contact plugs. The metal wirings serve as connecting terminals of the resistance dividing circuit. Arbitrary resistances can be obtained by selecting the connecting terminals. The resistance dividing circuit having such a configuration has been described in a patent document 1 (see Japanese Patent Publication No. Hei 5(1993)-30072).

In the resistance dividing circuit disclosed in FIG. 6, however, the contact plugs are directly connected to their corresponding polysilicon layer. Such a resistance dividing circuit as disclosed in FIG. 6 is normally configured such that its upper side is covered with an insulating layer. Thus, in order to form the contact plugs, there is a need to form contact holes in the insulating layer lying on the polysilicon layer. Upon opening the contact holes, it is hard to provide a suitable etching selection ratio between the insulating layer and the polysilicon layer because the insulating layer is normally $SiO_2$. Therefore, there is a high fear that etching will extend to the polysilicon layer upon opening of the contact holes. In doing so, the resistance of a portion where each of the contact plugs and the polysilicon layer contact varies.

In order to solve such a problem, the polysilicon layer and each contact plug may be connected with a silicide layer interposed therebetween. Since, however, the silicide layer is a material low in resistivity, the values of resistances of portions where the silicide layers are formed, decrease when the silicide layers are formed on the polysilicon layer corresponding to the resistance wiring. Even if the decreases in resistance value are slight, they are piled or built up since the contact plugs are arranged in series on the resistance wiring. Thus, the decreases in resistance value of the circuit as a whole cannot be ignored.

SUMMARY OF THE INVENTION

The present invention has been made in view of the foregoing problems. It is an object of the present invention to provide a resistance dividing circuit using polysilicon as a resistance wiring, which reduces variations in resistance value due to contact plugs connected to the resistance wiring, and a manufacturing method thereof.

In order to attain the above object, there is provided a resistance dividing circuit according to a first embodiment of the present invention, having a linear resistance wiring which extends onto a semiconductor substrate and which has a plurality of branch portions and is made up of polysilicon. The branch portions are formed on the semiconductor substrate. Further, the resistance dividing circuit is provided with silicide layers formed on the branch portions and has an insulating layer formed so as to cover the semiconductor substrate, the resistance wiring and the silicide layers, contact plugs extending through the insulating layer and having lower ends connected to the silicide layers, and fetching terminals connected to upper ends of the contact plugs.

There is also provided a method for manufacturing a resistance dividing circuit, according to a second embodiment of the present invention, comprising forming a linear resistance wiring having a plurality of branch portions and made up of polysilicon on a semiconductor substrate, forming silicide layers on the branch portions, and forming an insulating layer over the semiconductor substrate containing the resistance wiring and the silicide layers. Further, the method includes forming contact plugs extending through the insulating layer and having lower surfaces connected to the silicide layers, and forming fetching terminals respectively connected to upper surfaces of the contact plugs.

Since the silicide layers are provided on the polysilicon layer corresponding to the resistance wiring in the resistance dividing circuit according to the first embodiment of the present invention, the silicide layers serve as etching stoppers when the insulating layer is etched. Therefore, etching does not extend to the polysilicon layer upon opening of the contact holes. Thus, the resistance of a portion where each contact plug and the polysilicon layer are connected, can be held constant. Since the silicide layers are provided on the branch portions of the resistance wiring, decreases in resistance value of the resistance wiring due to the formation of the silicide layers are not built or piled up. Accordingly, the decreases in resistance value do not lead to a large decrease when considering the circuit as a whole.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

First Preferred Embodiment

Figure 1A:
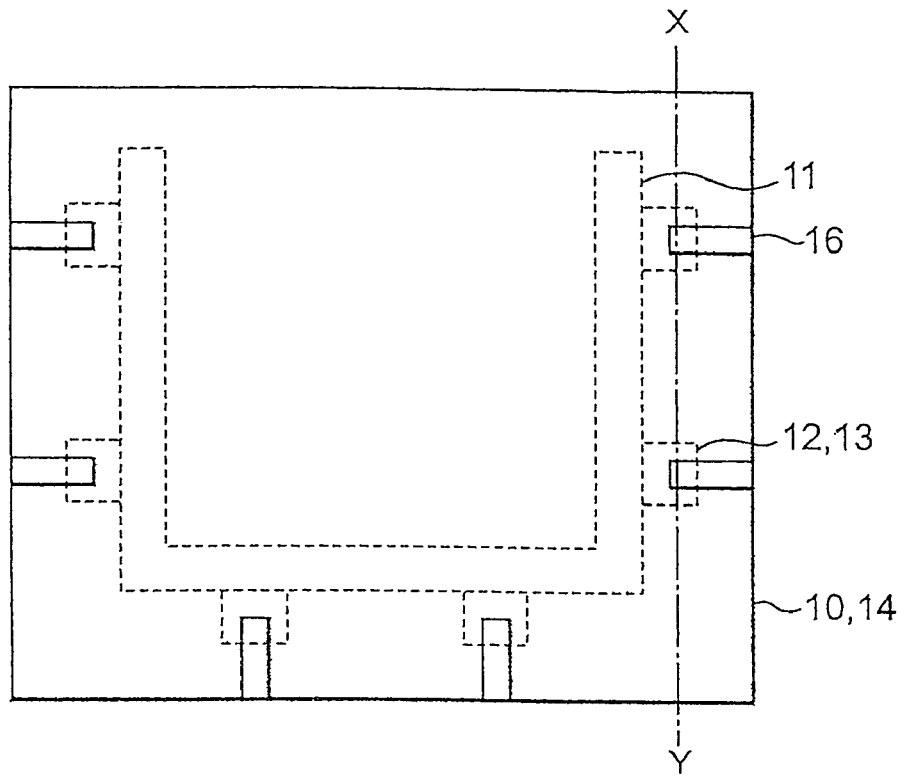
FIGS. 1A and 1B are respectively a plan view and a cross-sectional view showing a resistance dividing circuit of the present invention.
Figure 1B:
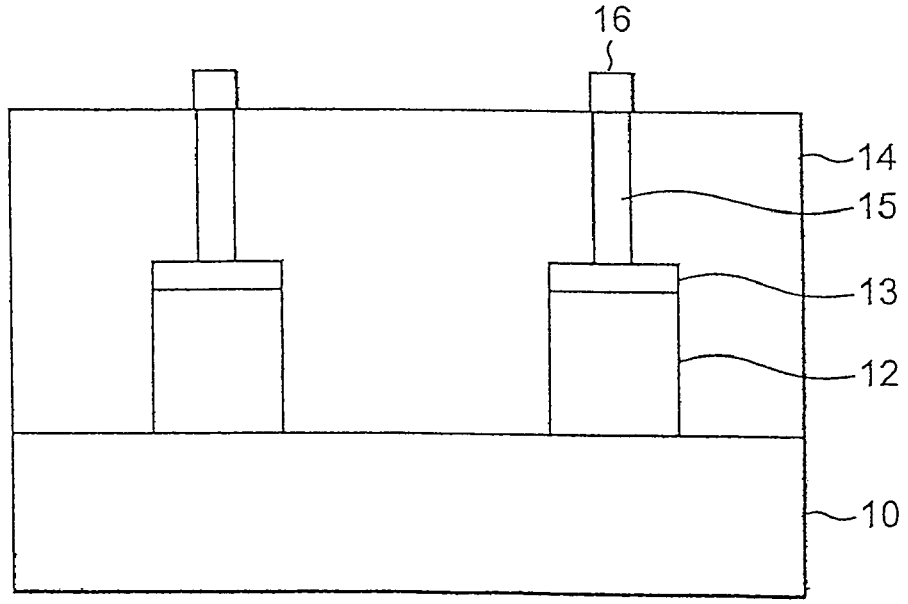

FIG. 1A is a plan view showing a resistance dividing circuit of the present invention. FIG. 1B is a cross-sectional view showing a cut section taken along line X-Y of FIG. 1A. The resistance dividing circuit of the present invention will be described using FIGS. 1A and 1B.

The resistance dividing circuit 20 of the present invention has a linear polysilicon layer 11 corresponding to a resistance wiring, which is provided on a semiconductor substrate 10. The polysilicon layer 11 has branch portions 12 provided at respective points thereof. Silicide layers 13 are respectively formed on the branch portions 12.

Further, the resistance dividing circuit 20 has an insulating layer 14 formed so as to cover the semiconductor substrate 10 containing the polysilicon layer 11 and the silicide layers 13. Furthermore, contact plugs 15 are formed so as to extend through the insulating layer 14 in the vertical direction. A portion below each contact plug 15 is connected to its corresponding silicide layer 13.

Then, metal wirings 16 used as taking-out or fetching terminals connected to the contact plugs 15 at their upper portions are formed on the insulating layer 14.

The resistance dividing circuit according to the first embodiment of the present invention is provided with the silicide layers 13 provided on the polysilicon layer 11 which serves as the resistance wiring. Therefore, the silicide layers 13 serve as etching stoppers used when the insulating layer 14 is etched to define or open contact holes. Therefore, this etching is effected on the insulating layer 14, but not on the polysilicon layer 11 when the contact holes are opened. Thus, connected portions of the contact plugs 15 and the polysilicon layer can be made identical in shape to the contact plugs 15 respectively. Consequently, the respective contact plugs 15 can be made constant in resistance value.

The silicide layers 13 are provided on their corresponding branch portions 12 of the polysilicon layer 11 and exist only in portions for connecting the fetching terminals and the main body of the resistance wiring. Accordingly, the resistance of the main body of the resistance wiring is not reduced. In other words, any paths each extending from one fetching terminal to another fetching terminal are not via more than two of the silicide layers 13. Thus, decreases in the resistance value of the resistance wiring due to the formation of the silicide layers 13 are not built up. Therefore, the decreases in resistance value do not lead to a large decrease in the circuit as a whole.

Figure 3:
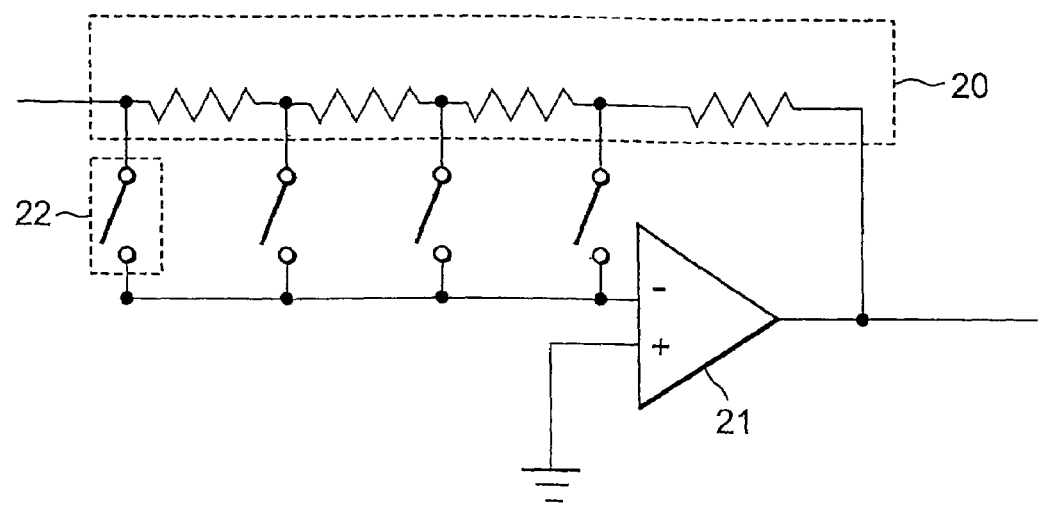
FIG. 3 is a view depicting a circuit to which the resistance dividing circuit of the present invention is applied.

The resistance dividing circuit 20 of the present invention can be applied to, for example, such a circuit as shown in FIG. 3, i.e., a programmable gain amplifier (PGA). The PGA is a circuit which outputs a signal antiphase to an input signal. The PGA is directed to one capable of controlling the gain (amplification factor) of the outputted signal.

Figure 4:
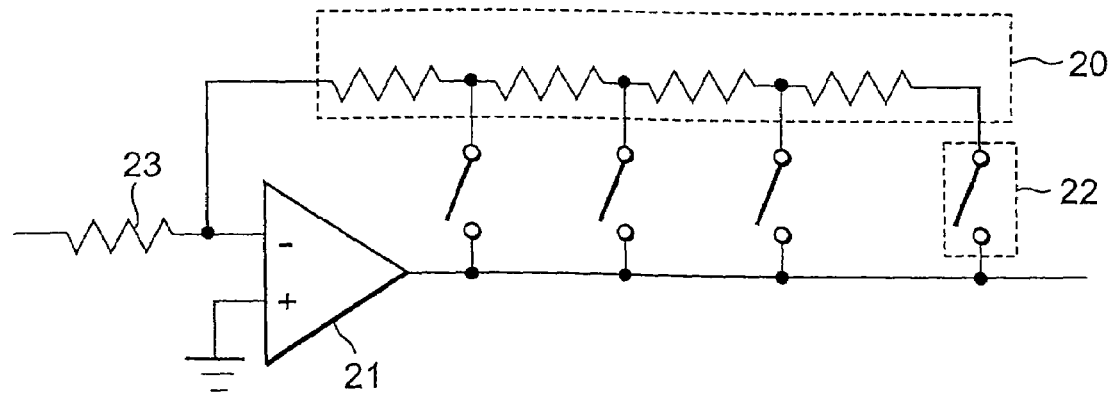
FIG. 4 is a view showing a circuit to which the resistance dividing circuit of the present invention is applied.

The PGA has such a circuit configuration as shown in FIG. 3 or 4, for example. In the circuit shown in FIG. 3, one end of the resistance dividing circuit 20 is connected to an output terminal of an operational (hereinafter abbreviated as "OP") amplifier 21. A plurality of taking-out or fetching electrodes of the resistance dividing circuit 20 are respectively parallel-connected to a low-voltage input terminal of the OP amplifier 21 via discrete switches 22. A high-voltage input terminal of the OP amplifier 21 is grounded. The signal is inputted to the other end of the resistance dividing circuit 20.

In the circuit shown in FIG. 4, one end and a plurality of fetching electrodes of a resistance dividing circuit 20 are respectively parallel-connected to an output terminal of an OP amplifier 21 via discrete switches 22. The other end of the resistance dividing circuit 20 is connected to the corresponding low-voltage input terminal of the OP amplifier 21. A high-voltage input terminal of the OP amplifier 21 is grounded. Further, an input resistor 23 is connected to the low-voltage input terminal. A signal is inputted to the low-voltage input terminal via the input resistor 23.

In either applied example, the plurality of switches 22 to be turned ON are selected to control the gain of the signal to be outputted. The gain of the outputted signal is determined by R2/R1 corresponding to a ratio of a resistance value (R1) between the input terminal and the low-voltage input terminal to a resistance value (R2) between the output terminal and the low-voltage input terminal.

Figure 5:
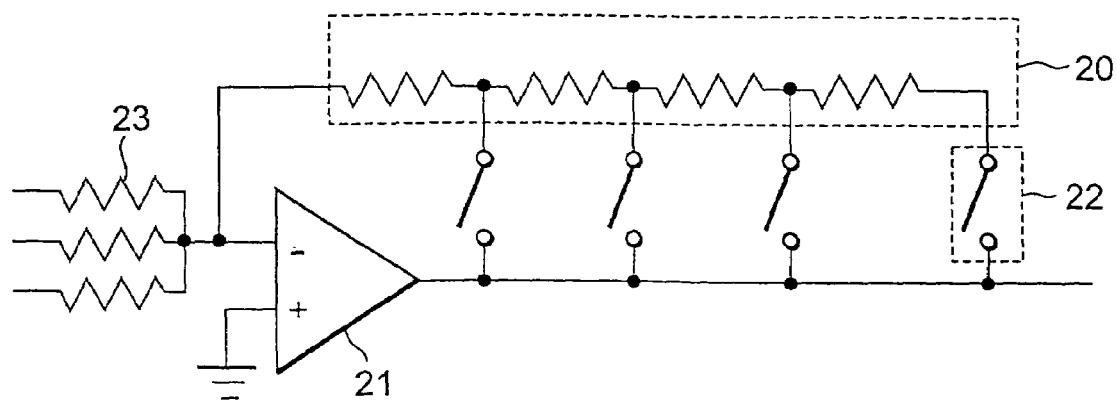
FIG. 5 is a view illustrating a circuit to which the resistance dividing circuit of the present invention is applied.
Figure 6:
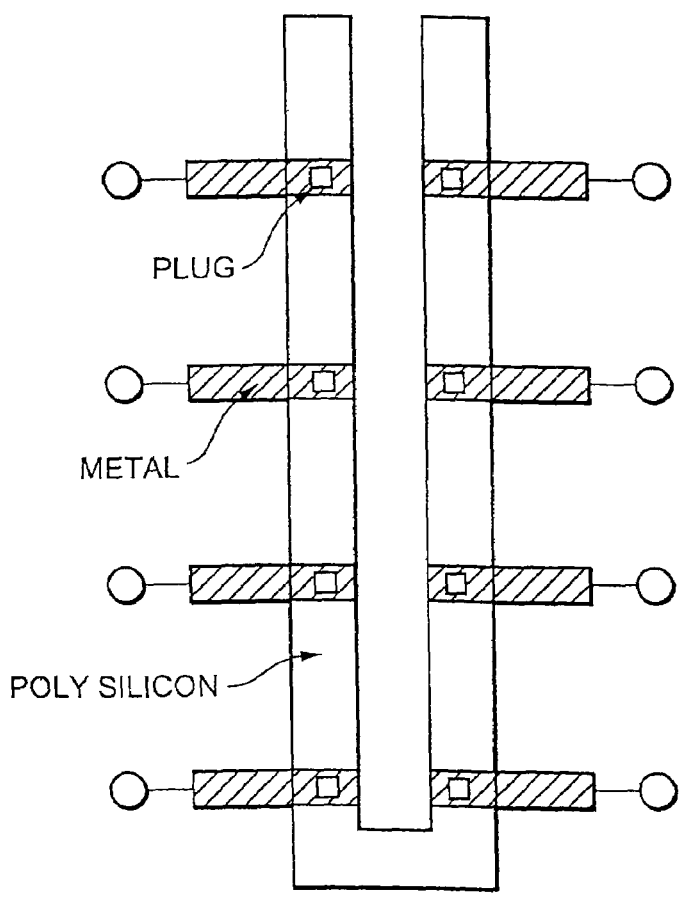
FIG. 6 is a plan view showing one example of a conventional resistance dividing circuit.

If input resistors 23 different in resistance value from one another are parallel-connected to a low-voltage input terminal in plural form as shown in FIG. 5 where the resistance dividing circuit 20 of the present invention is applied to the circuit shown in FIG. 4 in particular, it is then possible to control R1 as well as R2 by selecting the input resistors 23 used for signal input.

FIGS. 2A, 2C, 2E, 2G, 2I, 2K, 2M and 2O are respectively plan views showing a method for manufacturing a resistance dividing circuit of the present invention. FIGS. 2B, 2D, 2F, 2H, 2J, 2L, 2N and 2P are respectively cross-sectional views showing cut cross-sections taken along lines X-Y of FIGS. 2A, 2C, 2E, 2G, 2I, 2K, 2M and 2O. The method of manufacturing the resistance dividing circuit of the present invention will be explained using FIGS. 2A through 2P.

Figure 2A:
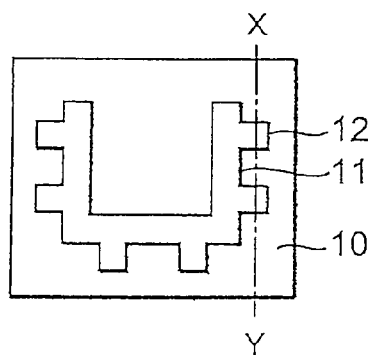
FIGS. 2A, 2C, 2E, 2G, 2I, 2K, 2M and 2O are plan views.
Figure 2B:
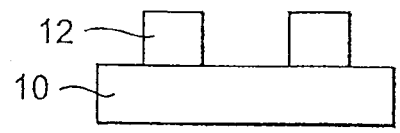
FIGS. 2B, 2D, 2F, 2H, 2J, 2L, 2N and 2P are respective cross-sectional views illustrating a method of manufacturing a resistance dividing circuit of the present invention.

As shown in FIG. 2A and FIG. 2B, a linear polysilicon layer 11, which serves as a resistance wiring, is formed on a semiconductor substrate 10. At this time, the polysilicon layer 11 is formed so as to have branch portions 12 at arbitrary portions of the polysilicon layer 11.

Figure 2C:
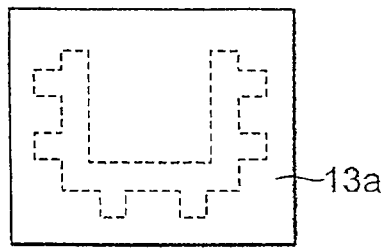
Figure 2D:
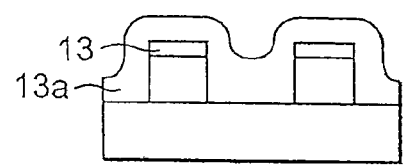

Subsequently, as shown in FIGS. 2C and 2D, a metal layer 13a is deposited over the entire semiconductor substrate 10 including the polysilicon layer 11. Thereafter, the metal layer 13a is caused to react with the polysilicon layer 11 by heat treatment to selectively form silicide layers 13 on the polysilicon layer 11 (salicide process).

Figure 2E:
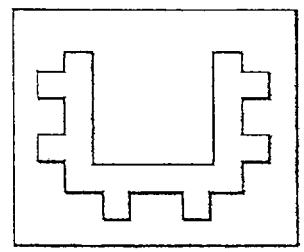
Figure 2F:
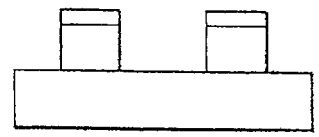

After the salicide process, the metal layer 13a, which did not react with the polysilicon layer 11, is removed as shown in FIGS. 2E and 2F.

Figure 2G:
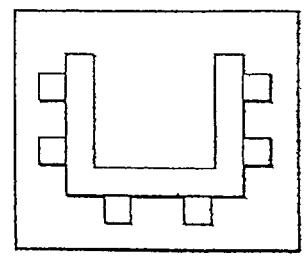
Figure 2H:
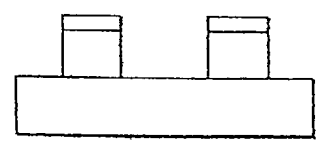

Thereafter, as shown in FIGS. 2G and 2H, the silicide layers 13 are selectively removed by photolithography and etching to cause the silicide layers 13 to remain only on the branch portions 12.

Figure 2I:
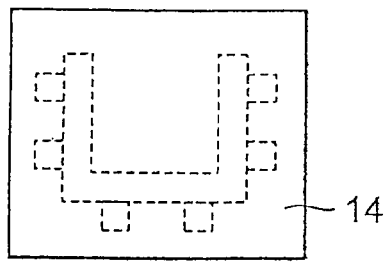
Figure 2J:
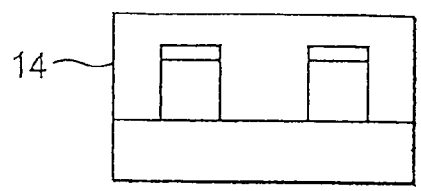

Further, as shown in FIGS. 2I and 2J, $SiO_2$ is formed over the entire semiconductor substrate 10 containing the polysilicon layer 11 and the silicide layers 13 as an insulating layer 14.

Figure 2K:
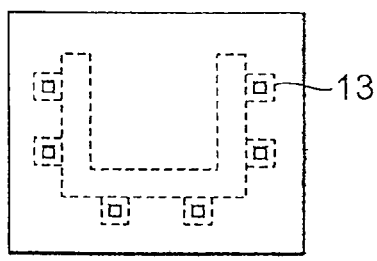
Figure 2L:
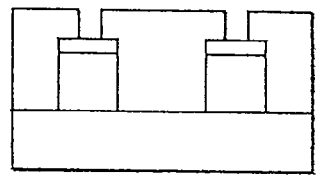

Next, as shown in FIGS. 2K and 2L, portions of the insulating layer 14, which correspond to the silicide layers 13, are opened by photolithography and etching to expose the silicide layers 13.

Figure 2M:
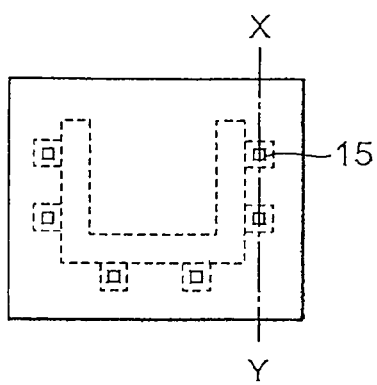
Figure 2N:
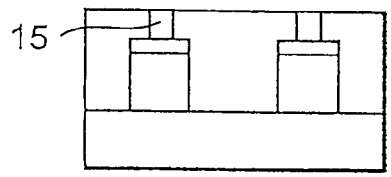

Then, as shown in FIGS. 2M and 2N, contact plugs 15 made up of doped polysilicon or a metal are charged into their corresponding openings.

Figure 2O:
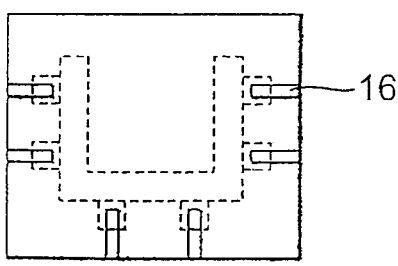
Figure 2P:
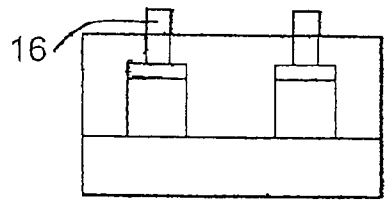

Finally, as shown in FIGS. 2O and 2P, metal wirings 16 respectively connected to the contact plugs 15 are formed on the insulating layer 14, thereby leading to completion of the resistance dividing circuit of the present invention.

While the preferred forms of the present invention have been described, it is to be understood that modifications will be apparent to those skilled in the art without departing from the spirit of the invention. The scope of the invention is to be determined solely by the following claims.

What is claimed is:

1. A resistance element comprising:
a polysilicon pattern formed on a semiconductor substrate, said polysilicon pattern having a main portion and a plurality of branch portions protruded from the main portion;
an insulating layer formed so as to cover the semiconductor substrate and said polysilicon pattern and having a plurality of contact holes defined therein, each of the contact holes being located over a corresponding branch portion;
a plurality of contact plugs formed within the contact holes;
a wiring pattern formed on said contact plug and said insulating layer; and
a silicide layer formed between said contact plug and said polysilicon pattern,
wherein a silicide layer is not formed on the main portion of said polysilicon pattern.

2. The resistance element according to claim 1, wherein said polysilicon pattern has a plurality of bend portions.

3. The resistance element according to claim 1, wherein said polysilicon pattern has a first straight portion extending in a first direction and a second straight portion extending in a second direction perpendicular to the first direction.

4. A resistance element comprising:
a polysilicon pattern formed on a semiconductor substrate, said polysilicon pattern having a trunk portion and a plurality of branch portions;
an insulating layer formed so as to cover the semiconductor substrate and said polysilicon pattern and having a plurality of contact holes defined therein, each of the contact holes being located over a corresponding branch portion;
a plurality of contact plugs formed within the contact holes;
a wiring pattern formed on said contact plug and said insulating layer; and
a silicide layer formed between said contact plug and said polysilicon pattern,
wherein a silicide layer is not formed on the trunk portion of said polysilicon pattern.

5. The resistance element according to claim 4, wherein said polysilicon pattern has a plurality of bend portions.

6. The resistance element according to claim 4, wherein said polysilicon pattern has a first straight portion extending in a first direction and a second straight portion extending in a second direction perpendicular to the first direction.

7. A resistance element comprising:
a polysilicon pattern formed on a semiconductor substrate, said polysilicon pattern having a main portion and a plurality of branch portions protruded from the main portion;
an insulating layer formed so as to cover the semiconductor substrate and said polysilicon pattern and having a plurality of contact holes defined therein, each of the contact holes corresponding to a predetermined area of the branch portions;
a silicide layer formed on the predetermined areas of the branch portions;
a contact plug formed on the silicide layer; and
a wiring pattern formed on said contact plug and said insulating layer,
wherein a silicide layer is not formed on the main portion of said polysilicon pattern.

8. The resistance element according to claim 7, wherein said polysilicon pattern has a plurality of bend portions.

9. The resistance element according to claim 7, wherein said polysilicon pattern has a first straight portion extending in a first direction and a second straight portion extending in a second direction perpendicular to the first direction.

10. A method for manufacturing a resistance element, comprising:
forming a polysilicon pattern on a semiconductor substrate, said polysilicon pattern having a main portion and a plurality of branch portions:
depositing a metal layer on said polysilicon pattern to form a silicide layer on a surface of said polysilicon pattern;
removing the silicide layer on said main portion so that the silicide layer remains on said branch portions;
forming an insulating layer over the semiconductor substrate and said polysilicon pattern;
forming contact holes in said insulating layer to expose said silicide layer;
forming contact plugs on said silicide layer; and
forming a wiring pattern on said contact plug and said insulating layer.

* * * * *